US010693495B2

(12) United States Patent
Liaghati

(10) Patent No.: US 10,693,495 B2
(45) Date of Patent: Jun. 23, 2020

(54) DATA COLLECTION DEVICE WITH EFFICIENT DATA COMPRESSION

(71) Applicant: THE BOEING COMPANY, Chicago, IL (US)

(72) Inventor: Amir Leon Liaghati, Huntsville, AL (US)

(73) Assignee: THE BOEING COMPANY, Chicago, IL (US)

( * ) Notice: Subject to any disclaimer, the term of this patent is extended or adjusted under 35 U.S.C. 154(b) by 200 days.

(21) Appl. No.: 15/728,796

(22) Filed: Oct. 10, 2017

(65) Prior Publication Data

US 2019/0109600 A1 Apr. 11, 2019

(51) Int. Cl.
| H04L 12/00 | (2006.01) |
| H03M 7/40 | (2006.01) |
| H04L 29/06 | (2006.01) |
| H04L 29/08 | (2006.01) |
| H04L 1/00 | (2006.01) |

(52) U.S. Cl.
CPC ........... *H03M 7/40* (2013.01); *H03M 7/4037* (2013.01); *H04L 1/00* (2013.01); *H04L 1/004* (2013.01); *H04L 67/12* (2013.01); *H04L 69/22* (2013.01); *H04L 69/04* (2013.01)

(58) Field of Classification Search
CPC ............. H04L 65/1059; H04L 65/4069; H04L 65/602; H04L 67/38; H04L 65/4084; H04L 67/303
USPC ........................................ 709/219, 218, 220
See application file for complete search history.

(56) References Cited

U.S. PATENT DOCUMENTS

| 4,546,342 A * | 10/1985 | Weaver | H03M 7/42 341/51 |
| 5,537,551 A * | 7/1996 | Denenberg | H03M 7/42 341/55 |
| 5,841,381 A * | 11/1998 | Nakayama | G06T 9/005 341/67 |
| 5,995,118 A * | 11/1999 | Masuda | H03M 7/42 345/467 |
| 6,243,496 B1 * | 6/2001 | Wilkinson | H04N 5/9261 375/E7.047 |
| 6,782,318 B1 * | 8/2004 | Beesley | G01C 21/20 341/65 |
| 6,987,469 B2 | 1/2006 | Acharya et al. | |
| 7,096,360 B1 * | 8/2006 | Fries | H04L 25/14 713/168 |
| 7,263,107 B1 * | 8/2007 | Johnston | H04L 5/1438 370/401 |
| 7,310,055 B2 * | 12/2007 | Odagiri | H03M 7/3084 341/106 |
| 7,460,595 B2 | 12/2008 | Ungerboeck et al. | |
| 7,827,187 B2 * | 11/2010 | Raman | H03M 7/40 382/239 |

(Continued)

*Primary Examiner* — Frantz Coby
(74) *Attorney, Agent, or Firm* — Moore IP Law

(57) ABSTRACT

A method includes generating data at a first device. The method includes determining one or more parameters corresponding to a statistical distribution of values based on the data. The method includes encoding the data based on a frequency-based code that is based on the statistical distribution to generate compressed data. The method further includes sending the one or more parameters and the compressed data from the first device to the second device.

20 Claims, 10 Drawing Sheets

(56) References Cited

U.S. PATENT DOCUMENTS

| | | | | |
|---|---|---|---|---|
| 8,305,947 B2* | 11/2012 | Wang | .................... | H04L 65/80 |
| | | | | 370/311 |
| 8,521,910 B2* | 8/2013 | Mitsuhashi | ............. | H04L 67/28 |
| | | | | 709/240 |
| 8,717,203 B2 | 5/2014 | Fallon | | |
| 8,786,473 B2* | 7/2014 | Samuels | ............. | H03M 7/3084 |
| | | | | 341/62 |
| 9,325,343 B2* | 4/2016 | Howard | ............. | H03M 7/3064 |
| 9,680,499 B2* | 6/2017 | Nagata | .................... | H03M 7/30 |
| 9,727,574 B2* | 8/2017 | Francis | .................... | H04L 67/06 |
| 9,953,436 B2* | 4/2018 | Li | ............................. | G06T 9/00 |
| 2007/0233623 A1* | 10/2007 | Vatchkov | ............... | G06N 3/088 |
| | | | | 706/19 |
| 2008/0103710 A1* | 5/2008 | Wegener | ............. | G01R 13/029 |
| | | | | 702/66 |
| 2013/0262538 A1* | 10/2013 | Wegener | ................ | H03M 7/30 |
| | | | | 708/203 |
| 2016/0336960 A1* | 11/2016 | Henry | ................. | H03M 7/3086 |
| 2018/0338017 A1* | 11/2018 | Mekuria | ................ | H04L 69/04 |
| 2019/0191230 A1* | 6/2019 | Li | ............................. | H04Q 9/00 |

* cited by examiner

DATA COLLECTION DEVICE WITH EFFICIENT DATA COMPRESSION

FIELD OF THE DISCLOSURE

The present disclosure is generally related to data collection and compression.

BACKGROUND

Advances in technology have resulted in electronic devices (e.g., "internet of things" (IoT) devices) being used to share larger amounts of data with other devices. However, many of these electronic devices are small and may lack the memory resources needed to store the substantial amount of data being generated. Additionally, sharing such data between devices may result in substantial network overhead. To address these concerns, data compression techniques are used to decrease the size of the data. One technique for compressing data is Huffman coding.

To encode data using Huffman coding, data is analyzed to determine the number of occurrences of each possible value, and a Huffman table is generated that maps more frequently occurring values to smaller codewords and less frequently occurring values to larger codewords. To enable a decoder to decode data that is encoded using a particular Huffman code, the encoder sends (e.g., in a header or other portion of the data) encoding data indicative of the particular Huffman code. For larger Huffman tables, the size of the encoding data can be substantial, which reduces the amount of compressed data that can be stored at a memory or increases overhead in a network due to the transmission of the encoding data in addition to the compressed data.

SUMMARY

In a particular implementation, a method includes generating data at a first device and determining one or more parameters corresponding to a statistical distribution of values based on the data. The method includes encoding the data based on a frequency-based code that is based on the statistical distribution to generate compressed data. The method further includes sending the one or more parameters and the compressed data from the first device to a second device.

In another particular implementation, a device includes a sensor configured to generate data, a memory configured to store the data, and a processor coupled to the memory and configured to execute instructions to perform operations. The operations include determining a mean and a standard deviation corresponding to a statistical distribution of values based on the data. The operations include encoding the data based on a Huffman code that is based on the statistical distribution to generate compressed data. The operations further include storing the mean, the standard deviation, and the compressed data at the memory.

In another particular implementation, a device includes a network interface configured to receive one or more parameters and compressed data from a second device. The one or more parameters correspond to a statistical distribution of values. The device includes a memory and a processor coupled to the memory and configured to execute instructions to perform operations that include determining a frequency-based code based on the statistical distribution that is based on the one or more parameters. The operations include decoding the compressed data, based on the frequency-based code, to generate data. The operations further include storing the data at the memory.

DETAILED DESCRIPTION

Figure 1:
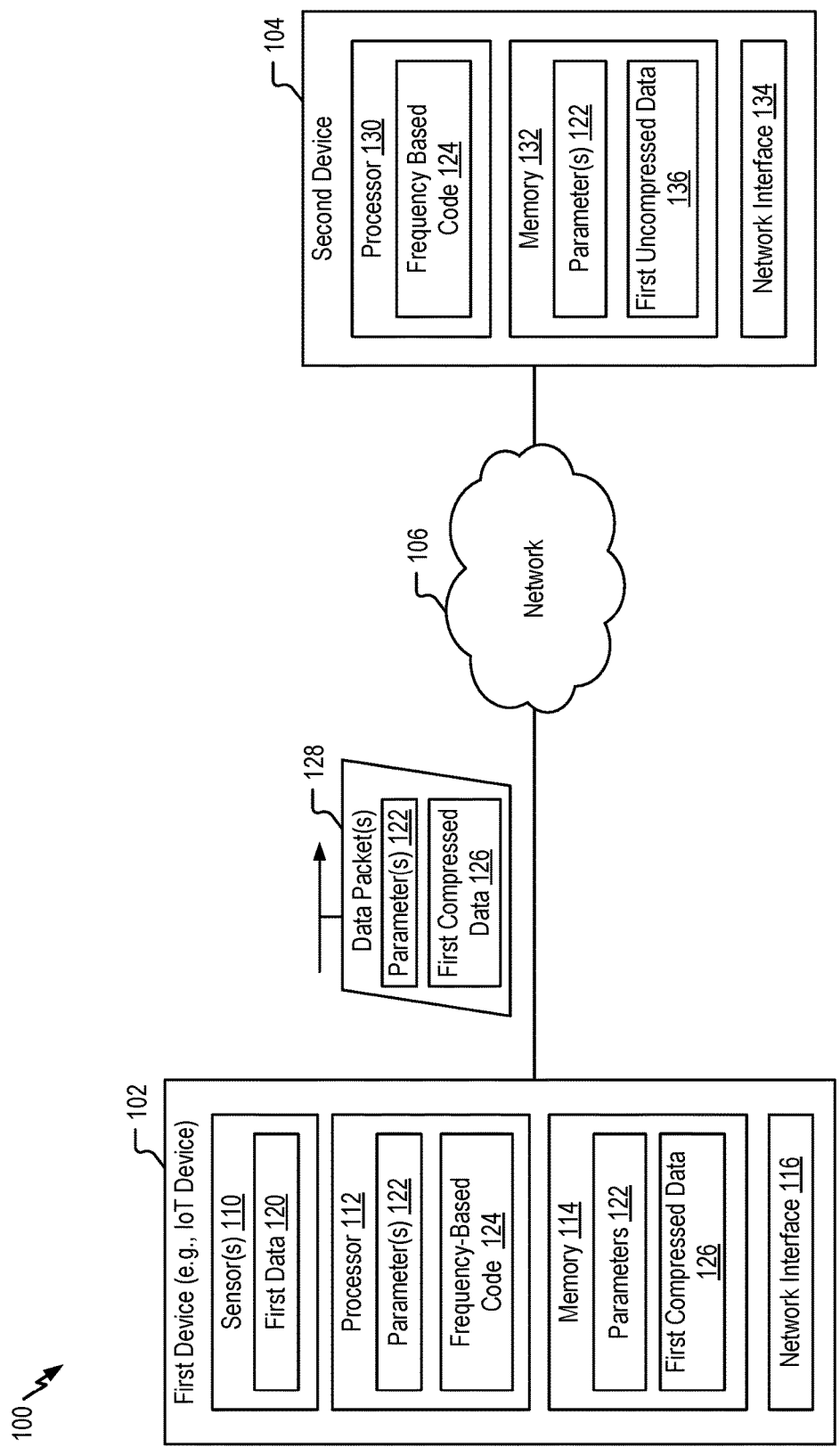
FIG. 1 is a block diagram that illustrates a particular implementation of a system that generates compressed data and one or more parameters associated with an encoding used to compress the data.

Particular implementations are described with reference to the drawings. In the description, common features are designated by common reference numbers throughout the drawings. As used herein, various terminology is used for the purpose of describing particular implementations only and is not intended to be limiting. For example, the singular forms "a," "an," and "the" are intended to include the plural forms as well, unless the context clearly indicates otherwise. It may be further understood that the terms "comprise," "comprises," and "comprising" may be used interchangeably with "include," "includes," or "including." Additionally, it will be understood that the term "wherein" may be used interchangeably with "where." As used herein, "exemplary" may indicate an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

In the present disclosure, terms such as "determining", "calculating", "generating", "adjusting", "modifying", etc. may be used to describe how one or more operations are performed. It should be noted that such terms are not to be construed as limiting and other techniques may be utilized to perform similar operations. Additionally, as referred to herein, "generating", "calculating", "using", "selecting", "accessing", and "determining" may be used interchangeably. For example, "generating", "calculating", or "determining" a parameter (or a signal) may refer to actively generating, calculating, or determining the parameter (or the signal) or may refer to using, selecting, or accessing the parameter (or signal) that is already generated, such as by another component or device. Additionally, "adjusting" and "modifying" may be used interchangeably. For example, "adjusting" or "modifying" a parameter may refer to changing the parameter from a first value to a second value (a "modified value" or an "adjusted value"). As used herein, "coupled" may include "communicatively coupled," "electrically coupled," or "physically coupled," and may also (or alternatively) include any combinations thereof. Two devices (or components) may be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled may be included in the same device or in different devices and may be connected via electronics, one or more connectors, or inductive coupling, as illustrative, non-limiting examples. In some implementations, two devices (or components) that are communicatively coupled, such as in electrical communication, may send and receive electrical signals (digital signals or analog signals) directly or indirectly, such as via one or more wires, buses, networks, etc. As used herein, "directly coupled" may include two devices that are coupled (e.g., communicatively coupled, electrically coupled, or physically coupled) without intervening components.

Implementations disclosed herein are directed to systems, apparatus, methods, and computer-readable mediums for compressing data using less overhead than conventional Huffman coding. For example, a device in accordance with the present disclosure includes a processor and a memory coupled to the processor. As non-limiting examples, the device may be integrated on-board a vehicle, such as an aircraft, or may include or correspond to an "Internet of Things" (IoT) device. In a particular implementation, the device includes (or is communicatively coupled to) a sensor that is configured to generate sensor data (e.g., temperature data, pressure data, etc.). The device may be configured to generate more data than can be stored at the memory. In order to store such data, the device is configured to compress the data using a frequency-based code, such as a Huffman code.

During operation, the device generates and stores a first portion of data (e.g., sensor readings, etc.) at the memory. In response to detection of a threshold condition (e.g., a particular amount of data stored at the memory, a particular amount of time generating the data, receipt of a message from another device, etc.), the processor analyzes the first portion of data to determine a statistical distribution of values that "fits" or models the first portion of data. For example, the processor may determine a statistical distribution of values that models the data within particular tolerances. The processor also determines one or more parameters (e.g., probabilistic parameters) that correspond to the statistical distribution of values. For example, the processor may determine a mean and a standard deviation of a Gaussian distribution that models the first portion of data.

After determining the one or more parameters, the processor determines a frequency-based code based on the statistical distribution and encodes the first portion of the data based on the frequency-based code to generate first compressed data. In a particular implementation, the processor determines a Huffman code based on the statistical distribution and uses the Huffman code to encode the first portion of the data to generate the first compressed data. After generating the first compressed data, the processor may store the one or more parameters and the first compressed data at the memory, may transmit the one or more parameters and the first compressed data to a second device, or both. In a particular implementation, the processor appends a header that indicates the one or more parameters to the first compressed data and sends the header and the first compressed data to the second device (or stores the header and the first compressed data at the memory).

The second device receives the one or more parameters and generates the frequency-based code (e.g., the same frequency-based code used by the device) based on the one or more parameters. After generating the frequency-based code, the second device may decode the first compressed data based on the frequency-based code to generate uncompressed data that substantially matches the first portion of the data. Because the one or more parameters take less storage space than data describing the frequency-based code, more compressed data can be stored at the memory, the compressed data can be shared with less network overhead, or both, as compared to including the data describing the frequency-based code with the first compressed data.

In some implementations, the frequency-based code may be changed "on the fly". For example, a second portion of data may be generated (or received) by the processor for storage at the memory. The processor analyzes the second portion of data (or a combination of the first portion of data and the second portion of data) to determine one or more updated parameters, such as an updated mean and an updated standard deviation. Based on the one or more updated parameters, a second frequency-based code is determined. The processor encodes the second portion of data based on the second frequency-based code to generate second compressed data, and the second compressed data and the one or more updated parameters are stored at the memory, sent to the second device, or both. For example, a second header that includes the one or more updated parameters is appended to the second compressed data prior to storage at the memory or transmission to the second device. In this manner, frequency-based codes may be updated based on changes in received data, which may improve a compression rating, reduce a number of errors introduced by the frequency-based code, or both.

FIG. 1 illustrates an example of a particular implementation of a system 100 that generates compressed data and one or more parameters associated with an encoding used to compress the data. For example, data may be compressed using a frequency-based code that is determined based on a statistical distribution of values corresponding to the data to be compressed. The compressed data is stored with one or more parameters corresponding to the statistical distribution, which reduces a size of a memory needed to store the compressed data or reduces overhead in a network when transmitting the data as compared to storing (or transmitting) the compressed data with data indicative of the entire frequency-based code (e.g., storing or transmitting compressed data with a Huffman table used to compress the data). Thus, the system 100 can be implemented on devices having smaller memory resources (e.g., smaller memory footprints), such as devices of vehicle-based systems (e.g., aircraft systems) or "Internet of Things" (IoT) devices, as further described herein.

The system 100 includes a first device 102 and a second device 104. The first device 102 and the second device 104 may be communicatively coupled via a network 106, such as wireless local area network (WLAN) or a peer-to-peer (P2P) network, as non-limiting examples. In an alternate implementation, the first device 102 and the second device 104 are directly connected (e.g., via a wired connection or a wireless connection). In a particular implementation, the first device 102 and the second device 104 are integrated into a vehicle. For example, the system 100 may be integrated in an aircraft, an unmanned aerial vehicle (UAV) (e.g., a drone aircraft), a spacecraft, a satellite, a watercraft, or a land-based vehicle (a car, a truck, a tank, etc.). To illustrate, the first device 102 and the second device 104 may be sensor devices (or sensor reading devices) that are configured to generate (or receive) sensor data associated with an aircraft, such as temperature data, pressure data, altitude data, airspeed data, etc. In some implementations, the first device 102 generates (or receives) a substantial amount of sensor data, and thus is configured to compress the sensor data prior to storage (or transmission to the second device 104). Alternatively, the system 100 may be integrated within a building or structure, such as a refinery, a manufacturing facility, an airport, a space launch system, etc. In some implementations, the first device 102 or the second device 104 are permanently attached to a fixed location, such as a building, highway, or geographic feature. In other implementations, the first device 102 or the second device 104 are permanently attached to mobile objects including trucks, trailers, train cars, aircraft, delivery vehicles, etc. In other implementations, the first device 102 or the second device 104 are carried in packages, luggage, or shipping containers.

In another particular implementation, the first device 102 and the second device 104 are IoT devices. As non-limiting examples, the first device 102 and the second device 104 include or correspond to building and home equipment (e.g., smart home devices, internet-connected appliances, media devices, computers, robotic devices, etc.), environmental monitoring devices, infrastructure management devices, manufacturing equipment and monitoring devices, agricultural devices, energy management devices, medical and healthcare devices, vehicles, other devices capable of generating data and accessing a network, or a combination thereof. In a particular implementation, the first device 102 includes or corresponds to a device having limited memory resources, such as an IoT device, and the second device 104 includes or corresponds to a device having larger memory resources, such as a server or database.

The first device 102 includes one or more sensors 110, a processor 112, a memory 114, and a network interface 116. The one or more sensors 110 include a temperature sensor, a magnetometer, a radiation sensor, an air pressure sensor, an airflow sensor, a vibration sensor, an impact sensor, an accelerometer, or a combination thereof. As a particular example, the first device 102 includes or corresponds to part of an aircraft sensor system, and the one or more sensors 110 are configured to generate sensor data associated with the aircraft. Although the one or more sensors 110 are described as being integrated within the first device 102, in other implementations, the one or more sensors 110 are communicatively coupled to the first device 102. As a particular example, the first device 102 includes or corresponds to a sensor reading or sensor managing device that is configured to receive sensor data from one or more different sensors that are communicatively coupled to the first device 102. For example, the first device 102 may be part of a distributed sensor network that receives sensor data from multiple different sensors when the sensors have network connections.

The processor 112 is configured to execute one or more computer-readable instructions to perform the operations described herein. The memory 114 is configured to store sensor data or other data generated or received by the first device 102. In some implementations, the memory 114 is also configured to store the one or more computer-readable instructions. In other implementations, the one or more computer-readable instructions are stored at a different memory. The network interface 116 is configured to perform data communications with the second device 104 (or one or more other devices) via one or more networks, such as the network 106. For example, the network interface 116 is configured to send data or instructions to the second device 104, to receive data or instructions from second device 104, or both. In some implementations, the network interface 116 includes or corresponds to a transmitter, a receiver, a transceiver, or a combination thereof. The network interface 116 is configured to communicate via one or more wireless communication protocols, such as an Institute of Electrical and Electronics Engineers (IEEE) protocol, a Wi-Fi Alliance protocol, a Bluetooth® protocol, a Zigbee® protocol, a near-field communication protocol, a cellular protocol, a Long Term Evolution (LTE) protocol, or a combination thereof. Bluetooth is a registered trademark of Bluetooth Special Interest Group (SIG), and Zigbee is a registered trademark of Zigbee Alliance.

The second device 104 includes a processor 130, a memory 132, and a network interface 134. The second device 104 may include or correspond to another component of a vehicle, another IoT device, or a server, as non-limiting examples. The processor 130 is configured to execute one or more computer-readable instructions to perform the operations described herein. The memory 132 is configured to store data from one or devices, such as the first device 102. In some implementations, the memory 132 is also configured to store the one or more computer-readable instructions. In other implementations, the one or more computer-readable instructions are stored at a different memory. The network interface 134 is configured to perform data communications with the first device 102 (or one or more other devices) via one or more networks, such as the network 106. For example, the network interface 134 is configured to send data or instructions to the first device 102, to receive data or instructions from first device 102, or both. In some implementations, the network interface 134 includes or corresponds to a transmitter, a receiver, a transceiver, or a combination thereof. The network interface 134 is configured to communicate via one or more wireless communication protocols, such as an IEEE protocol, a Wi-Fi Alliance protocol, a Bluetooth protocol, a Zigbee protocol, a near-field communication protocol, a cellular protocol, a LTE protocol, or a combination thereof.

During operation, the one or more sensors 110 generate first data 120. As a non-limiting example, the one or more sensors 110 may generate temperate data during a flight of an aircraft or during a refining process at a refinery. In some implementations, the one or more sensors 110 are configured to generate sensor data in real-time or near real-time, and thus may generate a substantial amount of data. However, the first device 102 may not have sufficient memory resources to store all of the data generated by the one or more sensors 110. Additionally, or alternatively, the large amount of data may result in significant network overhead when transmitted to another device, such as the second device 104. In order to reduce the size of the data prior to storage or transmission, the data may be compressed. One method of data compression includes encoding data using frequency-based codes, such as a Huffman code. A Huffman code is a variable-length code in which entries that occur with higher frequencies are encoded using fewer bits than entries that occur with less frequency. Because the more common entries have fewer bits, data that is encoded using a frequency-based code result in encoded data having a smaller size than the original, unencoded (e.g., uncompressed) data. However, in order to decode the compressed data, data indicative of the entirety frequency-based code is stored with (or transmitted with) the compressed data. Such data may take significant space in memory, thereby reducing the amount of compressed data that can be stored, or may be associated with significant network overhead in transmitting the frequency-based code to other devices. The system 100 solves this technical problem by storing (or transmitting) one or more parameters associated with a statistical distribution instead of storing (or transmitting) data indicative of an entirety of the frequency-based code. The one or more parameters are stored using less memory and are transmitted using less network overhead than the data indicative of the frequency-based code, thereby increasing the amount of compressed data that can be stored, reducing overhead at the network 106, or both. In some implementations, data is compressed before it is stored at the memory 114. In other implementations, uncompressed data may be stored at the memory 114, and, in response to detection of a threshold condition, data may be compressed for storage at the memory 114, as further described herein.

To illustrate, the first device 102 determines one or more parameters 122 corresponding to a statistical distribution of values based on the first data 120. For example, the processor 112 analyzes the first data 120 determine a statistical distribution of values that models the first data 120. To illustrate, the first device 102 may generate multiple statistical distributions based on the first data 120 and select the statistical distribution that is associated with the smallest variance or other factor. In a particular implementation, the statistical distribution includes a Gaussian distribution, as further described with reference to FIG. 2. In other implementations, other types of statistical distributions are used. In a particular implementation, the one or more parameters 122 include a mean and a standard deviation. For example, the processor 112 may identify a Gaussian distribution that models the first data 120 and determine a mean and a standard deviation of the Gaussian distribution, as further described with reference to FIG. 2. In other implementations, other parameters are used.

After the one or more parameters 122 are determined, the first device 102 encodes the first data 120 based on a frequency-based code 124 that is based on the statistical distribution. For example, after determining the statistical distribution, the processor 112 generates the frequency-based code 124 based on the statistical distribution (and not based directly on the first data 120). The first device 102 may determine the frequency-based code 124 based on frequency values indicated by the statistical distribution and corresponding to one or more values indicated by the first data 120. For example, the statistical distribution may indicate frequency values corresponding to each of a plurality of discrete values that include one or more values indicated by the first data 120, and values corresponding to higher frequency values are encoded using fewer bits than values corresponding to lower frequency values. In a particular implementation, the frequency-based code 124 is a Huffman code. In other implementations, the frequency-based code 124 is a different type of code. Because the frequency-based code 124 is based on the statistical distribution (and not directly on the first data 120), the frequency-based code 124 may introduce one or more errors when compressing the first data 120. However, the number of errors may be few (e.g., depending on the statistical model that is determined) and may be outweighed by the increase storage and transmission efficiency, as further described herein.

After determining the frequency-based code 124, the first device 102 encodes the first data 120 based on the frequency-based code 124 to generate first compressed data 126. The first compressed data 126 is smaller (e.g., contains fewer bits) than the first data 120. In some implementations, the processor 112 causes the one or more parameters 122 and the first compressed data 126 to be stored at the memory 114. The one or more parameters 122 may be stored as metadata or in another fashion. In a particular implementation, the one or more parameters 122 are included in a header that is included with the first data 120, as further described with reference to FIG. 5. Because the one or more parameters 122 are stored using relatively few bits, most of the memory 114 may be used to store the first compressed data 126. In this manner, the first device 102 is able to store more compressed data at the memory 114 as compared to other data compression techniques because the one or more parameters 122 are stored using substantially fewer bits than data defining the frequency-based code 124.

Additionally, or alternatively, the first device 102 transmits the one or more parameters 122 and the first compressed data 126 to one or more other devices. For example, the network interface 116 sends one or more data packets 128 that include the one or more parameters 122 and the first compressed data 126 to the second device 104 via the network 106. In some implementations, the first compressed data 126 is transmitted responsive to generation of the first compressed data 126. In other implementations, the first compressed data 126 is not transmitted until satisfaction of a condition, such as expiration of a particular time period (e.g., for periodic data transmission), receipt of a request from the second device 104, availability of a connection to the network 106, or some other condition.

The second device 104 receives the one or more data packets 128 via the network interface 134. The processor 130 determines the frequency-based code 124 based on the one or more parameters 122. For example, the second device 104 determines the statistical distribution corresponding to the one or more parameters 122. As a particular example, the one or more parameters 122 include a mean and a standard deviation, and the second device 104 determines a Gaussian distribution based on the mean and the standard deviation. In other implementations, other parameters and other statistical distributions are used. Based on the statistical distribution, the second device 104 determines the frequency-based code 124. For example, the statistical distribution may indicate a discrete set of values and corresponding frequency values, and the frequency-based code 124 is determined based on the frequency values. Because the frequency-based code 124 is based on a statistical distribution indicated by the one or more parameters 122, the second device 104 determines the same code (e.g., the frequency-based code 124) that is used by the first device 102 without sharing any other data indicative of the frequency-based code 124.

The second device 104 uses the frequency-based code 124 to decompress the first compressed data 126. For example, the processor 130 decodes the first compressed data 126 based on the frequency-based code 124 to generate first uncompressed data 136. The first uncompressed data 136 is substantially similar to the first data 120 (although one or more errors may be introduced if the statistical distribution varies from the first data 120). In this manner, the second device 104 is able to receive compressed data and a few parameters, and, based on the parameters, determine the same code that was used by the first device 102 to compress the compressed data. Transmitting the first compressed data 126 with the one or more parameters 122 reduces network overhead as compared to transmitting the first compressed data 126 with data indicative of the frequency-based code 124.

Thus, the system 100 of FIG. 1 enables the first device 102 to store more compressed data than devices that operate in accordance with other data compression techniques. To illustrate, because the one or more parameters 122 are stored at the memory 114 instead of data indicative of the frequency-based code 124, more of the memory 114 is available to store the first compressed data 126. Thus, devices that are integrated in aircrafts or IoT devices, as non-limiting examples, can be designed to have smaller memory footprints (or to store more data using the same memory footprint). Additionally, compressed data can be transmitted at a higher data rate and using less network overhead than using other data compression techniques, because fewer bits are transmitted. For example, only the bits corresponding to the one or more parameters 122, and not bits corresponding to the frequency-based code 124, are transmitted.

Figure 2:
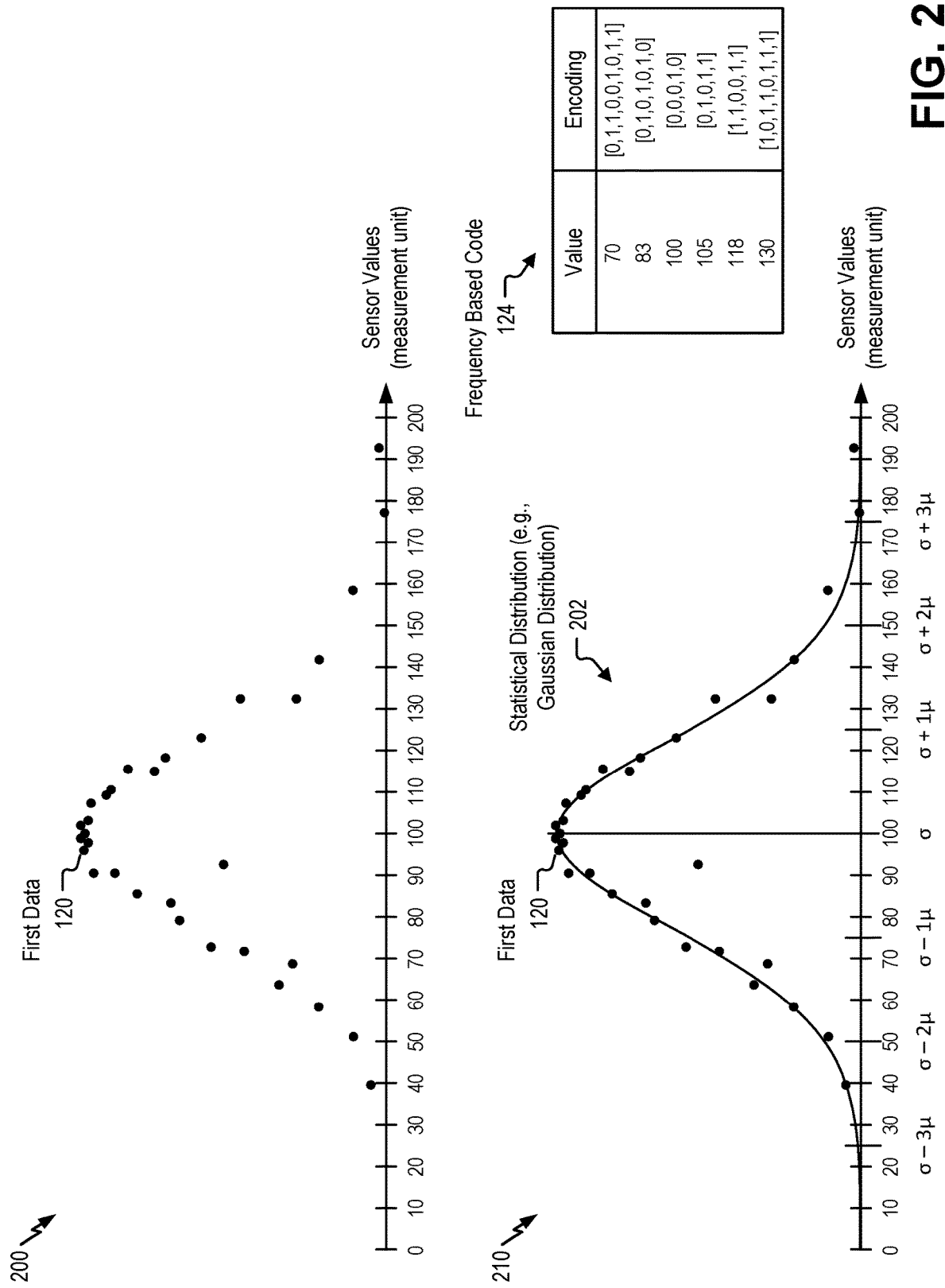
FIG. 2 illustrates an exemplary statistical distribution and an exemplary frequency-based code used by the system of FIG. 1.

FIG. 2 illustrates an exemplary statistical distribution and an exemplary frequency-based code used by the system of FIG. 1. FIG. 2 illustrates a first plot 200 illustrating illustrative values indicated by the first data 120 of FIG. 1, with the x-axis representing sensor values (in a particular measurement unit). The values illustrated in FIG. 1 are illustrative and are not intended to be limiting. In other examples, the first data 120 includes other values. As described with reference to FIG. 1, the first device 102 analyzes the first data 120 to determine a statistical distribution that models the values indicated by the first data 120.

FIG. 2 also illustrates a second plot 210 that includes a statistical distribution 202 (e.g., a Gaussian distribution) that is fit to the first data 120. The statistical distribution 202 models the first data 120 within specified tolerances (e.g., variance, etc.). The specified tolerances may be based on prestored values at the first device 102 or user input (e.g., during a setup process for the first device 102). Once the statistical distribution 202 is determined, one or more parameters (e.g., the one or more parameters 122 of FIG. 1) may be determined that correspond to the statistical distribution 202. For example, a mean $\sigma$ and a standard deviation $\mu$ may be determined. In the particular example illustrated in FIG. 2, $\sigma$ is 100 and $\mu$ is 25. In other examples, $\sigma$ and $\mu$ have different values. Although referred to as a statistical distribution, the distribution may also be referred to as a probabilistic distribution.

FIG. 2 also illustrates the frequency-based code 124 of FIG. 1. The frequency-based code 124 is based on the statistical distribution 202. To illustrate, each value of the discrete set of values indicated by the statistical distribution 202 is encoded, and the number of bits used to encode each value is based on the probability in the statistical distribution 202. For example, 100 and 105 are associated with high probability values in the statistical distribution 202 and are encoded using 5 bits, 118 is associated with a lower probability and is encoded using 6 bits, 83 is associated with a lower probability and is encoded using 7 bits, 130 is associated with a lower probability and is encoded using 8 bits, and 70 is associated with a very low probability and is encoded using 9 bits. Other values are similarly encoded. The encodings in FIG. 2 are illustrative and not intended to be limiting. In other implementations, other encodings are used.

Because the mean and the standard deviation are sufficient to define the statistical distribution 202, sending the mean and the standard deviation (e.g., the one or more parameters 122) to other devices enable the other devices to determine the same statistical distribution (e.g., the statistical distribution 202). Thus, because the frequency-based code 124 is based on the statistical distribution 202, the frequency-based code 124 (e.g., the same code) is able to be determined at other devices based on the mean and the standard deviation (as compared to sending data describing the frequency-based code 124 itself).

Figure 3:
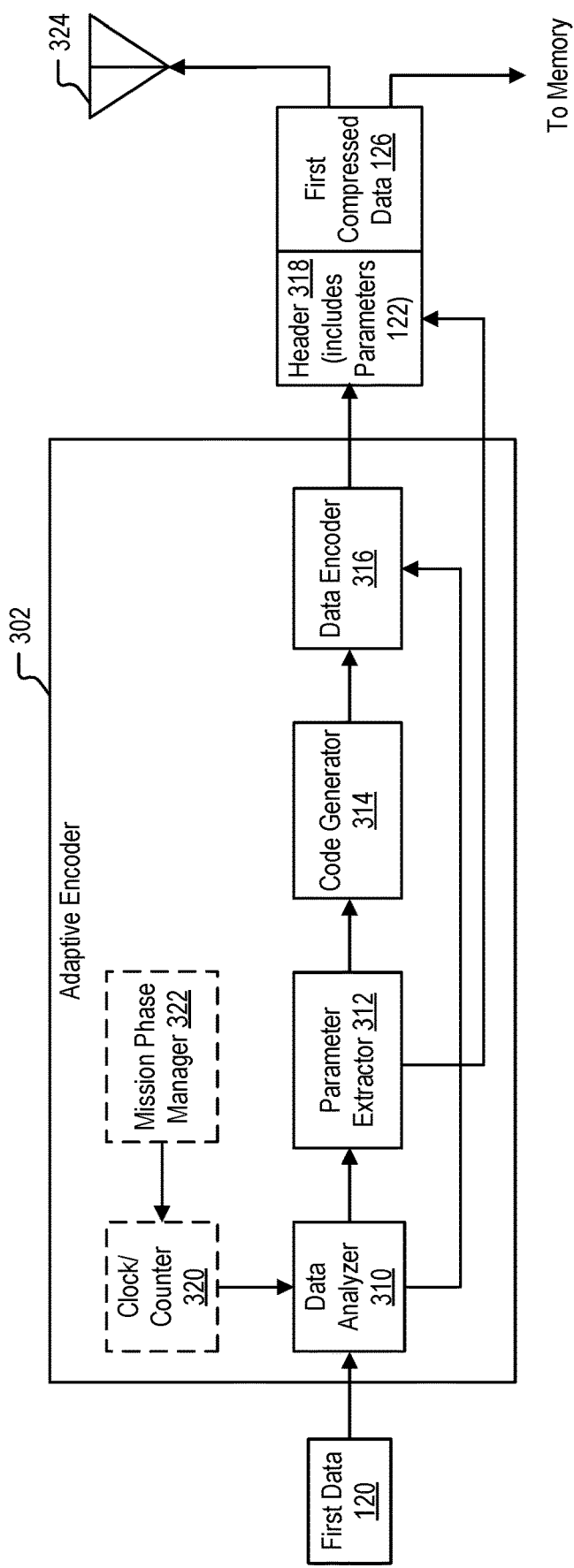
FIG. 3 is a block diagram that illustrates a particular implementation of an adaptive encoder that generates compressed data and one or more parameters.

Referring to FIG. 3, an example of a particular implementation of an adaptive encoder 302 that generates compressed data and one or more parameters is shown. In a particular implementation, the adaptive encoder 302 is included in or integrated in the first device 102 of FIG. 1.

The adaptive encoder 302 includes a data analyzer 310, a parameter extractor 312, a code generator 314, and a data encoder 316. The data analyzer 310 is configured to receive the first data 120 (e.g., from one or more sensors included in or communicatively coupled to the device that includes the adaptive encoder 302) and to analyze the first data 120 to determine a statistical distribution that models the first data 120. For example, as described with reference to FIG. 2, the data analyzer 310 determines a Gaussian distribution that models the first data 120. In other implementations, the statistical distribution is a different type of distribution, such as a binomial distribution, a Poisson distribution, a Cauchy distribution, etc. The statistical distribution is provided to the parameter extractor 312 and the analyzed first data 120 is provided to the data encoder 316.

The parameter extractor 312 is configured to extract the one or more parameters 122 from the statistical distribution. In a particular implementation, the parameter extractor 312 extracts the mean and the standard deviation, as described with reference to FIG. 2. In other implementations, other parameters are extracted. The one or more parameters 122 are provided to the code generator 314 and are output from the adaptive encoder 302 (for inclusion with compressed data, as further described herein).

The code generator 314 is configured to receive the one or more parameters 122 and to generate the frequency-based code 124 based on the one or more parameters 122. To illustrate, the code generator 314 may generate a Huffman code based on the statistical distribution indicated by the one or more parameters 122, as described with reference to FIG. 3. In other implementations, other types of frequency-based codes are used. The frequency-based code 124 is provided to the data encoder 316.

The data encoder 316 is configured to encode the first data 120 (received from the data analyzer 310) based on the frequency-based code 124. In a particular implementation, values corresponding to higher frequency/probability values with respect to the statistical distribution are encoded using fewer bits than values associated with lower frequency/probability values. Encoding the first data 120 based on the frequency-based code 124 generates the first compressed data 126.

After the first compressed data 126 is generated, the one or more parameters 122 are included with the first compressed data 126 for transport to a final destination. In a particular implementation, the adaptive encoder 302 generates a header 318 that includes the one or more parameters 122 and that is appended to the first compressed data 126 to generate a data file. The data file may be sent to another device, such as through transmission via an antenna 324, the data file may be stored at a memory, or both.

In a particular implementation, the adaptive encoder 302 includes a clock/counter 320 and a mission phase manager 322. The mission phase manager 322 is configured to store mission data and parameters, including data and parameters indicative of various phases of a mission to be performed by the device that includes the adaptive encoder 302. For example, the adaptive encoder 302 may be integrated onboard a satellite, and the mission phase manager 322 stores data and parameters indicative of various phases of a mission performed by the satellite. The mission phase manager 322 is further configured to cause the data analyzer 310 to analyze the incoming data in order to update the parameters for different phases of the mission. For example, the mission phase manager 322 may access the clock/counter 320 and determine whether a new phase has begun, and thus the one or more parameters 122 should be updated. In a particular implementation, each phase of the mission is associated with generating (or receiving) different data (e.g., data representing values in different ranges) and therefore a statistical distribution that models data from one phase may be different (e.g., have different parameters) than a statistical distribution that models data from another phase. Thus, data for each phase may be analyzed and the one or more parameters 122 may be updated during each phase.

Figure 4:
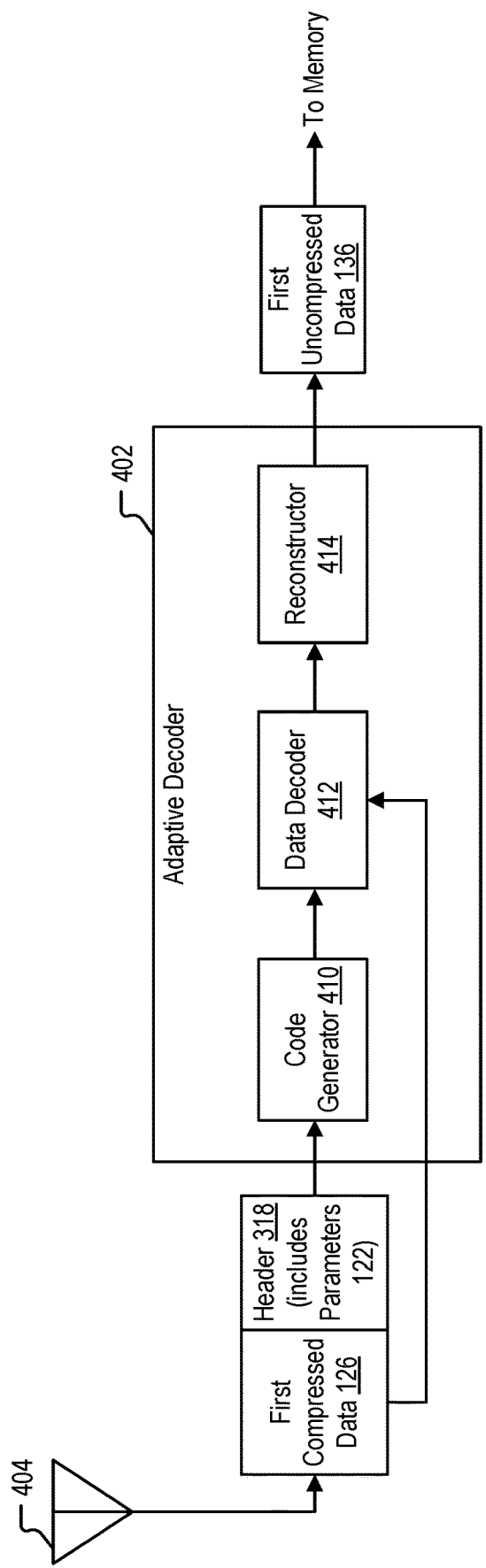
FIG. 4 is a block diagram that illustrates a particular implementation of an adaptive decoder that decompresses data based on one or more parameters.

Referring to FIG. 4, an example of a particular implementation of an adaptive decoder 402 that decompressed data based on one or more parameters is shown. In a particular implementation, the adaptive decoder 402 is included in or integrated in the second device 104 of FIG. 1.

The adaptive decoder 402 includes a code generator 410, a data decoder 412, and a reconstructor 414. The code generator 410 is configured to receive the first compressed data 126 and the one or more parameters 122. For example, the adaptive decoder 402 may be coupled to an antenna 404 that is configured to receive one or more data packets from another device, such as the first device 102 of FIG. 1. In a particular implementation, the one or more data packets include the header 318 (that includes the one or more parameters 122) and the first compressed data 126. The code generator 410 is configured to extract the one or more parameters 122 and to generate a frequency-based code (e.g., the frequency-based code 124 of FIG. 1) based on the one or more parameters. For example, the code generator 410 may extract a mean and a standard deviation and may determine a statistical distribution that corresponds to the mean and the standard deviation. The code generator 410 may generate the frequency-based code based on the statistical distribution. In a particular implementation, the code generator 410 generates a Huffman code based on the one or more parameters 122. The frequency-based code is provided to the data decoder 412.

The data decoder 412 is configured to receive the first compressed data 126 and to decode the first compressed data 126 to generate the first uncompressed data 136. For example, the data decoder 412 may decode the first compressed data 126 in accordance with the frequency-based code to generate the first uncompressed data 136. The reconstructor 414 may be configured to perform one or more reconstruction operations on the first uncompressed data 136 prior to the first uncompressed data 136 being output by the adaptive decoder 402, such as for storage at a memory. The one or more reconstruction operations include parity operations, error correction operations, other operations, or a combination thereof. Thus, because the first compressed data 126 is decoded using the same frequency-based code used to encode the first compressed data 126 (e.g., at the adaptive encoder 302), the first uncompressed data 136 is substantially similar to the data received at the adaptive encoder 302. To illustrate, the first uncompressed data 136 may be the same, or may have a small number of errors introduced due to the variance between the statistical model and the actual data.

Figure 5:
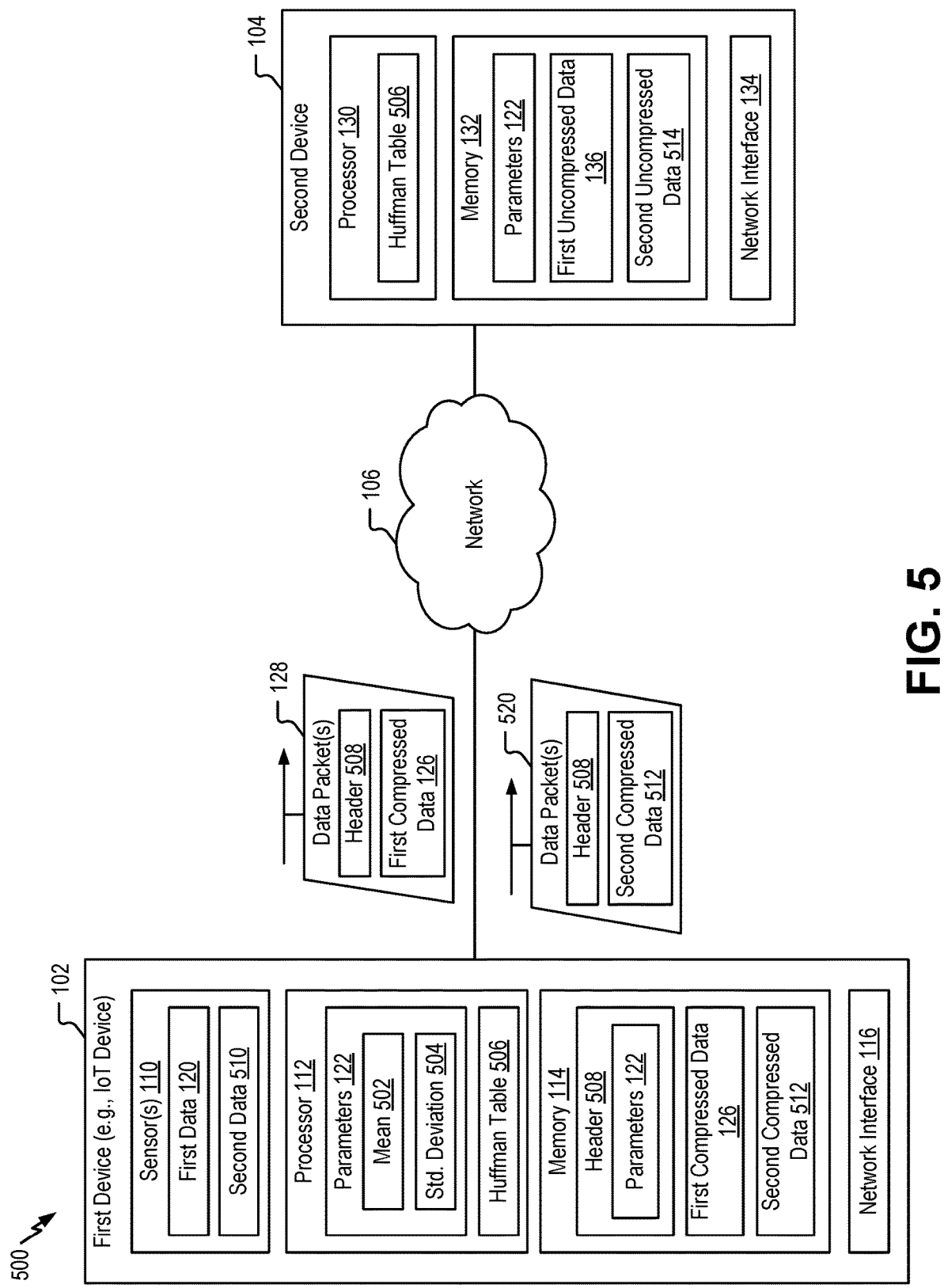
FIG. 5 is a block diagram that illustrates a particular implementation of a system that compresses data using a Huffman code based on one or more parameters.

Referring to FIG. 5, an example of a particular implementation of a system 500 that compresses data using a Huffman code based on one or more parameters is shown. The system 500 includes the first device 102 communicatively coupled via the network 106 to the second device 104.

During operation, the first device 102 is configured to generate sensor data and to compress the sensor data for storage or transmission. To illustrate, the one or more sensors 110 generate the first data 120, and the first device 102 determines a statistical distribution that models the first data 120. For example, the processor 112 may analyze the first data 120 and determine a statistical distribution that models the first data 120. In a particular implementation, the statistical distribution includes a Gaussian distribution. After determining the statistical model, the first device 102 identifies a mean 502 and a standard deviation 504 corresponding to the statistical distribution, as described with reference to FIG. 2. The mean 502 and the standard deviation 504 correspond to the one or more parameters 122. Additionally, the first device 102 determines a Huffman table 506 based on the statistical distribution, as described with reference to FIG. 2. The first device 102 uses the Huffman table 506 to encode the first data 120 to generate the first compressed data 126.

In a particular implementation, the first device 102 stores the first compressed data 126 at the memory 114. To illustrate, the first device 102 generates a header 508 that includes the one or more parameters 122 (e.g., the mean 502 and the standard deviation 504). The processor 112 causes the header 508 and the first compressed data 126 to be stored at the memory 114. Because the one or more parameters 122 are stored at the memory 114 instead of the Huffman table 506, the memory 114 is able to store more compressed data (e.g., a smaller portion of the memory 114 is used to store the one or more parameters 122 than to store the Huffman table 506). In another particular implementation, the first device 102 sends one or more data packets 128 that include the one or more parameters 122 and the first compressed data 126 to the second device 104. For example, the network interface 116 is configured to send the one or more parameters 122 (e.g., the mean 502 and the standard deviation 504) and the first compressed data 126 to the second device 104. Sending the first compressed data 126 with the one or more parameters 122 uses less network overhead than sending the compressed data 126 with the Huffman table 506, and the one or more data packets 128 may be sent at a higher data rate than data packets that include the Huffman table 506.

The second device 104 receives the one or more data packets 128 via the network 106 and extracts the one or more parameters 122 from the header 508. The second device 104 determines a statistical distribution that corresponds to the one or more parameters 122 (e.g., to the mean 502 and the standard deviation 504). For example, the processor 130 extract the mean 502 and the standard deviation 504 and determine a statistical distribution having the same mean and standard deviation. The second device 104 determines the Huffman table 506 based on the statistical distribution. After determining the Huffman table 506, the second device 104 uses the Huffman table 506 to decode the first compressed data 126 to generate the first uncompressed data 136. The first uncompressed data 136 may be stored at the memory 132 or provided to another device.

In some implementations, data generated by the one or more sensor 110 is expected to be within a similar range of values at different times. In this implementation, additional sensor data may be compressed using the generated parameters and code. To illustrate, the one or more sensors 110 generates second data 510, and the first device 102 encodes the second data 510 based on the Huffman table 506 to generate second compressed data 512. In a particular implementation, the second compressed data 512 is stored at the memory 114. For example, the processor 112 stores the second compressed data 512 in a section of the memory 114 that is associated with the header 508. Thus, because the first compressed data 126 and the second compressed data 512 are stored in the same section of the memory 114, the first compressed data 126 and the second compressed data 512 are decoded using the same parameters (e.g., the mean 502 and the standard deviation 504). In another implementation, first device 102 sends one or more data packets 520 that include the header 508 (including the one or more parameters 122) and the second compressed data 512 to the second device 104.

The second device 104 receives the one or more data packets 520 and, based on extracting the same parameters (e.g., the mean 502 and the standard deviation 504), the second device 104 uses the Huffman table 506 to decode the second compressed data 512 to generate the second uncompressed data 514. The second uncompressed data 514 may be stored at the memory 132 or provided to another device. In this manner, FIG. 5 illustrates an example of compressing multiple data sets using a single frequency-based code (e.g., the Huffman table 506).

Figure 6:
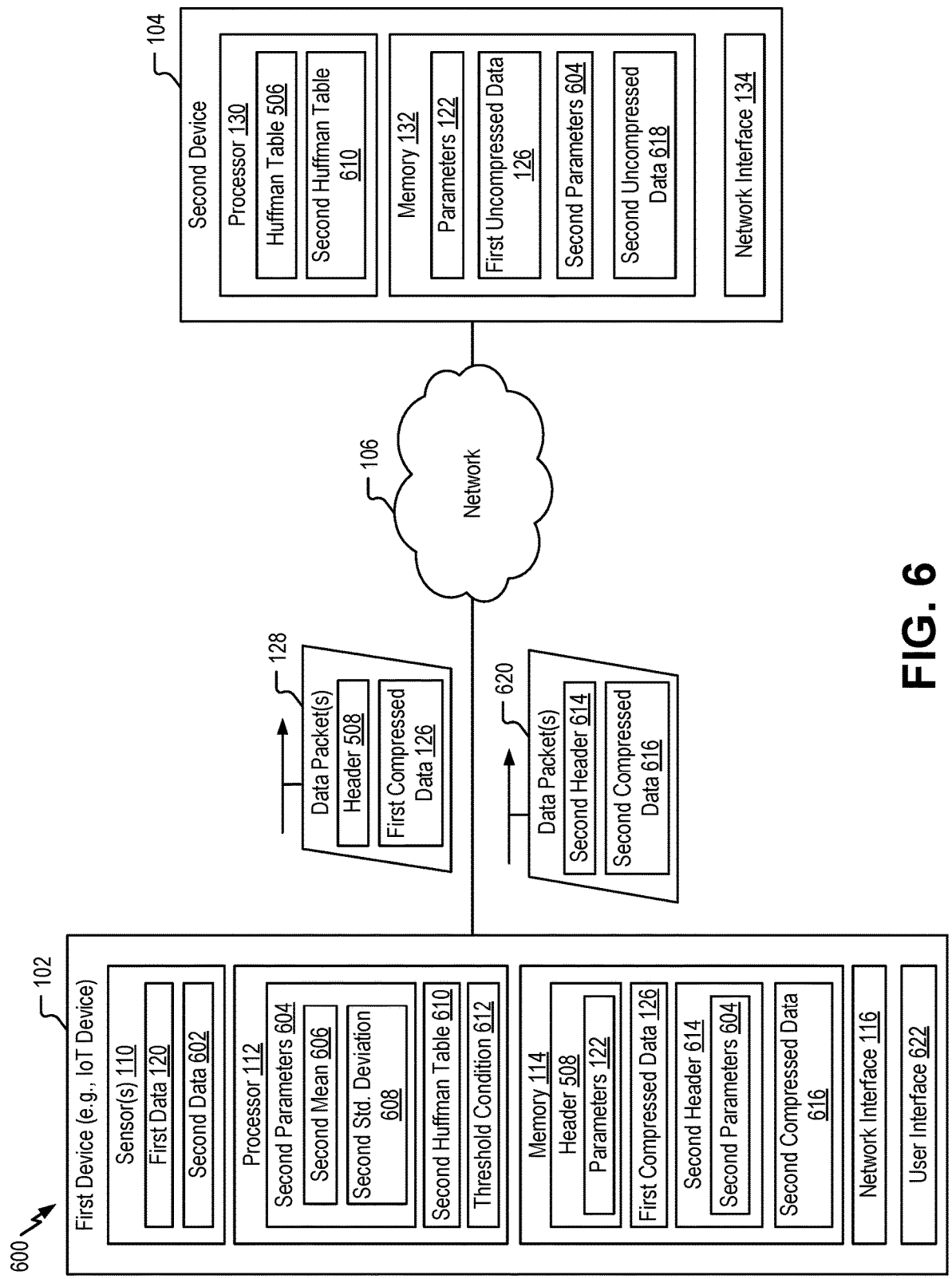
FIG. 6 is a block diagram that illustrates a particular implementation of a system that modifies a Huffman code based on changes in received data.

Referring to FIG. 6, an example of a particular implementation of a system 600 that modifies a Huffman code based on changes in received data is shown. The system 600 includes the first device 102 communicatively coupled via the network 106 to the second device 104.

During operation, the first device 102 encodes the first data 120 using the Huffman table 506 to generate the first compressed data 126, and the first device 102 sends the one or more parameters 122 (e.g., the mean 502 and the standard deviation 504) and the first compressed data 126 to the second device 104, as described with reference to FIGS. 1 and 5. The second device 104 uses the one or more parameters 122 to generate the Huffman table 506, and the second device 104 decodes the first compressed data 126 using the Huffman table 506 to generate the first uncompressed data 136, as described with reference to FIGS. 1 and 5.

The one or more sensor 110 may continue to generate additional data for compression. However, in at least some implementations, the additional data is sufficiently different that the determined statistical distribution no longer models the data. Thus, based on detection of a threshold condition 612, the first device 102 changes the frequency-based code "on the fly" (e.g., during operation) to better fit the data to be encoded.

To illustrate, the one or more sensors 110 generate second data 602. The second data 602 may be generated in different conditions, such as during different phases of a mission, using different sensors, or in some other manner such that the second data 602 represents a different range of values (or a different distribution of values) than the first data 120. While processing (or receiving) the second data 602, the first device 102 monitors for a threshold condition 612. The threshold condition 612 is a condition that, when satisfied, causes the first device 102 to change the frequency-based code used to compress data. The threshold condition 612 may be based on the second data 602, based on a time, or another condition.

In a particular implementation, the threshold condition 612 corresponds to an amount of data stored at a memory. To illustrate, in some implementations, the first data 120 is stored at the memory 114 prior to encoding. When a particular amount of data is stored at the memory 114, such as 50% of the available memory, the threshold condition 612 is triggered and the first data 120 is compressed. As the first compressed data 126 is stored at the memory 114, when 50% of the available memory is used, the threshold condition 612 is triggered again, and the Huffman table 506 is changed. In another particular implementation, the threshold condition 612 corresponds to a difference between a value of a first parameter of the one or more parameters 122 and a value of a second parameter of a second set of parameters. To illustrate, the first device 102 may determine a second statistical distribution based on the second data 602, and if a difference between a value of at least one of the one or more parameters 122 and a value of a corresponding parameter associated with the second statistical distribution satisfies (e.g., is greater than or equal to) a threshold, the threshold condition 612 is satisfied. In another particular implementation, the threshold condition 612 corresponds to a size of the second data 602. For example, if the size (e.g., the number of bits) of the second data 602 satisfies a threshold, the threshold condition 612 is satisfied. In another particular implementation, the threshold condition 612 corresponds to an amount of time associated with generating the second data 602. For example, the first device 102 may access a clock or a counter when the first data 120 or the second data 602 is being generated (or received), and if a duration of time satisfies a threshold, the threshold condition 612 is satisfied. Although described as satisfying the threshold condition 612 when a corresponding value is greater than or equal to a threshold, in other implementations, the threshold condition 612 is satisfied when the corresponding value is less than (or less than or equal to) the threshold.

In another particular implementation, the threshold condition 612 corresponds to a compression rate. For example, as additional data is encoded using the Huffman table 506, some particular values may occur in the additional data with a higher frequency than the particular values occurred in the first data 120. However, because the Huffman table 506 is already determined, these particular values may be encoded using more bits than other, less frequently-occurring values, which reduces the overall compression rate of data encoded using the Huffman table 506. Thus, the first device 102 may monitor the compression rate associated with data that is encoded using the Huffman table 506, and when the compression rate falls below a threshold, the threshold condition 612 is satisfied. In another particular implementation, the threshold condition 612 corresponds to receipt of an instruction from the second device 104. For example, the first device 102 may be configured to modify the frequency-based code based on an instruction from the second device 104. In another particular implementation, the threshold condition 612 corresponds to a condition indicated by a mission profile stored at a memory (e.g., the memory 114 or another memory). For example, the threshold condition 612 may correspond to a condition indicated by mission profile data or parameters, as further described with reference to FIG. 3. In another particular implementation, the threshold condition 612 is modifiable based on a user input received at the first device 102. For example, any of the above-described illustrative threshold conditions may be set or modified based on values indicated by a user, such as during initialization or set-up of the first device 102. To illustrate, in some implementations, the first device 102 includes a user interface 622 (e.g., a touchscreen, a keypad, a keyboard, a voice-activated controller, etc.) configured to receive user input indicative of a value of the threshold condition 612.

Responsive to satisfaction of the threshold condition 612, the first device 102 determines a second set of parameters 604 corresponding to a second statistical distribution of values that is based at least in part on the second data 602. For example, the processor 112 determines a second statistical distribution that models the second data 602. The second distribution is associated with the second set of parameters 604. In a particular implementation, the second set of parameters 604 includes a second mean 606 and a second standard deviation 608. After determining the second statistical distribution, the first device 102 determines a second frequency-based code based on the second statistical distribution. In a particular implementation, the second frequency-based code includes or corresponds to a second Huffman table 610. The first device 102 encodes the second data 602 based on the second Huffman table 610 to generate second compressed data 616.

In a particular implementation, the first device 102 stores the second compressed data 616 at the memory 114. To illustrate, the first device 102 may append a second header 614 that includes the second set of parameters 604 (e.g., the second mean 606 and the second standard deviation 608) to the second compressed data 616. In this implementation, multiple compressed data chunks having different headers (which include different parameters) are stored at the memory 114, which enables the memory 114 to store more compressed data than if each compressed data chunk is stored with the corresponding frequency-based code. In another particular implementation, the first device 102 sends the second compressed data 616 and the second set of parameters 604 to the second device 104. For example, the processor 112 may generate one or more data packets 620 that include the second header 614 and the second compressed data 616, and the network interface 116 is configured to send the one or more data packets 620 to the second device 104 via the network 106.

The second device 104 receives the one or more data packets 620 and extracts the second set of parameters 604 (e.g., the second mean 606 and the second standard deviation 608). After extracting the second set of parameters 604, the second device 104 determines the second statistical distribution of values based on the second set of parameters 604. For example, the processor 130 may determine the same statistical distribution of values that was determined by the first device 102 using the second mean 606 and the second standard deviation 608. The second device 104 determines the second Huffman table 610 based on the second statistical distribution. Because the second Huffman table 610 is generated using the second statistical distribution (e.g., based on the second mean 606 and the second standard deviation 608), the second Huffman table 610 determined at the second device 104 is the same as the second Huffman table 610 determined at the first device 102.

After determining the second Huffman table 610, the second device 104 decodes the second compressed data 616 based on the second Huffman table 610 (e.g., a second frequency-based code that is based on the second statistical distribution) to generate second uncompressed data 618. The second uncompressed data 618 is stored at the memory 132 (or provided to another device). Although FIG. 6 illustrates that the one or more parameters 122 and the second set of parameters 604 are stored at the memory 132, in other implementations, the one or more parameters 122 and the second set of parameters 604 are stored in a volatile memory or another memory, and not in the memory 132. In this manner, FIG. 6 illustrates an example of changing the encoding "on-the-fly" such that different chunks of data are compressed more efficiently.

Figure 7:
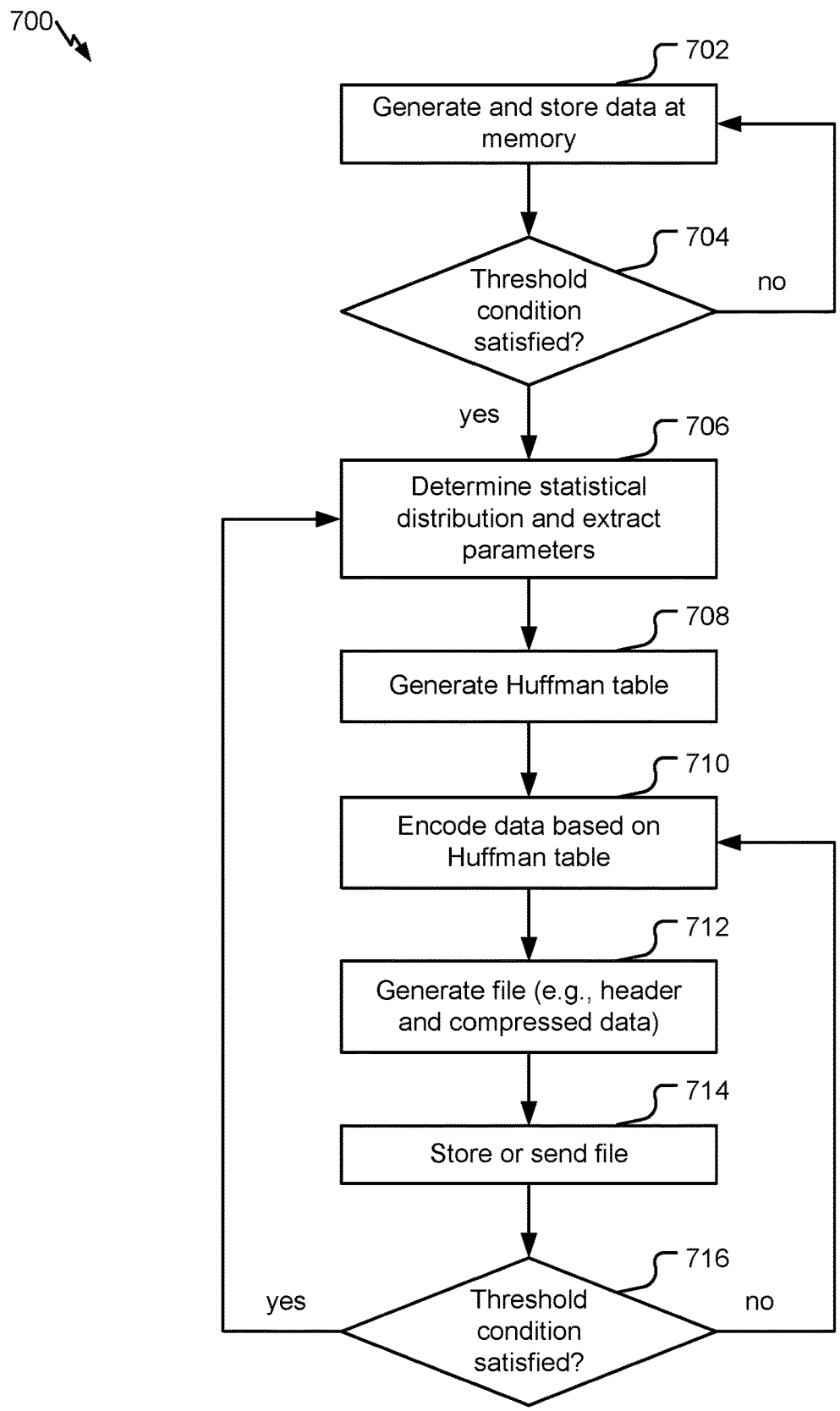
FIG. 7 is a flow chart of an exemplary method of adaptively modifying a Huffman code based on one or more threshold conditions.

FIG. 7 illustrates a method 700 of adaptively modifying a Huffman code based on one or more threshold conditions. In some implementations, the method 700 is performed by the first device 102 of FIGS. 1, 5, and 6 or the adaptive encoder 302 of FIG. 3, as non-limiting examples.

The method 700 includes generating and storing data at a memory, at 702. For example, the memory corresponds to the memory 114 and the data corresponds to the first data 120 of FIGS. 1, 5, and 6. In a particular implementation, one or more sensors (e.g., the one or more sensors 110) generate data to be stored at the memory. In other implementations, the data is received from external devices. For example, a sensor management device may receive sensor data from one or more sensors via a wireless network, or an IoT device may receive data from another IoT device via a peer-to-peer connection, as non-limiting examples. Thus, although FIGS. 1, 5, and 6 describe data that is generated by sensors integrated in the first device 102, in other implementations, the data is received at the first device 102 from other devices, or is generated in other manners (e.g., the data corresponds to systems other than sensors).

The method 700 includes determining whether a threshold condition is satisfied, at 704. The threshold condition corresponds to a size of data stored at the memory, a duration of time associated with generating the data, receipt of an instruction from a second device, a condition indicated by a mission profile stored at the memory, a difference between parameter values, other conditions, or a combination thereof, as non-limiting examples. If the threshold condition is not satisfied, the method 700 returns to 702, and more data is generated and stored. If the threshold condition is satisfied, the method 700 continues to 706.

The method 700 includes determining a statistical distribution corresponding to the data and extracting one or more parameters, at 706. For example, the data is analyzed to determine a statistical distribution, such as a Gaussian distribution, that models the data. Parameters associated with the statistical distribution, such as a mean and a standard deviation, as non-limiting examples, are also determined. The parameters are indicative of the statistical distribution such that other devices are able to determine the same statistical distribution based on the parameters.

The method 700 includes generating a Huffman table, at 708. For example, the Huffman table 506 is determined based on the statistical distribution, as described with reference to FIGS. 2 and 5. In other implementations, other frequency-based codes are used instead of a Huffman table. The method 700 includes encoding the data based on the Huffman table to generate compressed data, at 710. For example, the first compressed data 126 is generated by encoding the first data 120 using the Huffman table 506, as described with reference to FIG. 5.

The method 700 includes generating a file (e.g., a header and the compressed data), at 712. For example, the file includes a header, such as the header 508, that includes the one or more parameters (e.g., the mean 502 and the standard deviation 504) and that is appended to (or otherwise associated with) the first compressed data 126. The method 700 includes storing or sending the file, at 714. In a particular implementation, the file (e.g., the header and the compressed data) is sent to another device for storage, such as the second device 104 as described with reference to FIGS. 1, 5, and 6. In another particular implementation, the file (e.g., the header and the compressed data) is stored at a memory, such as at the memory 114. In some implementations, storing the file includes overwriting other data. To illustrate, in some implementations, as the data is generated (or received) at the first device, the data is stored at the memory of the first device. Data storage continues until the threshold condition is satisfied, at step 704. When the threshold condition is satisfied, the file (e.g., the header and the compressed data) is stored at the same location in memory that the data is stored, thereby overwriting the data with the file (which represents more data because the file includes compressed data). Thus, in some implementations, uncompressed data is temporarily stored at a memory until compressed data is generated for storage.

The method 700 includes determining whether a threshold condition is satisfied, at 716. If the threshold condition is not satisfied, the method 700 returns to 710, and additional data that is generated (or received) is compressed using the same Huffman table, and the compressed data is stored or sent to another device. If the threshold condition is satisfied, the method 700 returns to 706, and a new statistical distribution and new parameters are determined, such that a new Huffman table is generated. Thus, the Huffman table (or other frequency-based code) may be modified on-the-fly, which may result in a higher compression ratio than using a fixed Huffman table.

Thus, the method 700 enables data to be compressed using a frequency-based code (e.g., a Huffman code). The frequency-based code can be modified (e.g., when a threshold condition is satisfied) such that the frequency-based code is based on a new statistical distribution. Modifying the frequency-based code during operation enables data to be compressed with higher efficiency than using a static frequency-based code.

Figure 8:
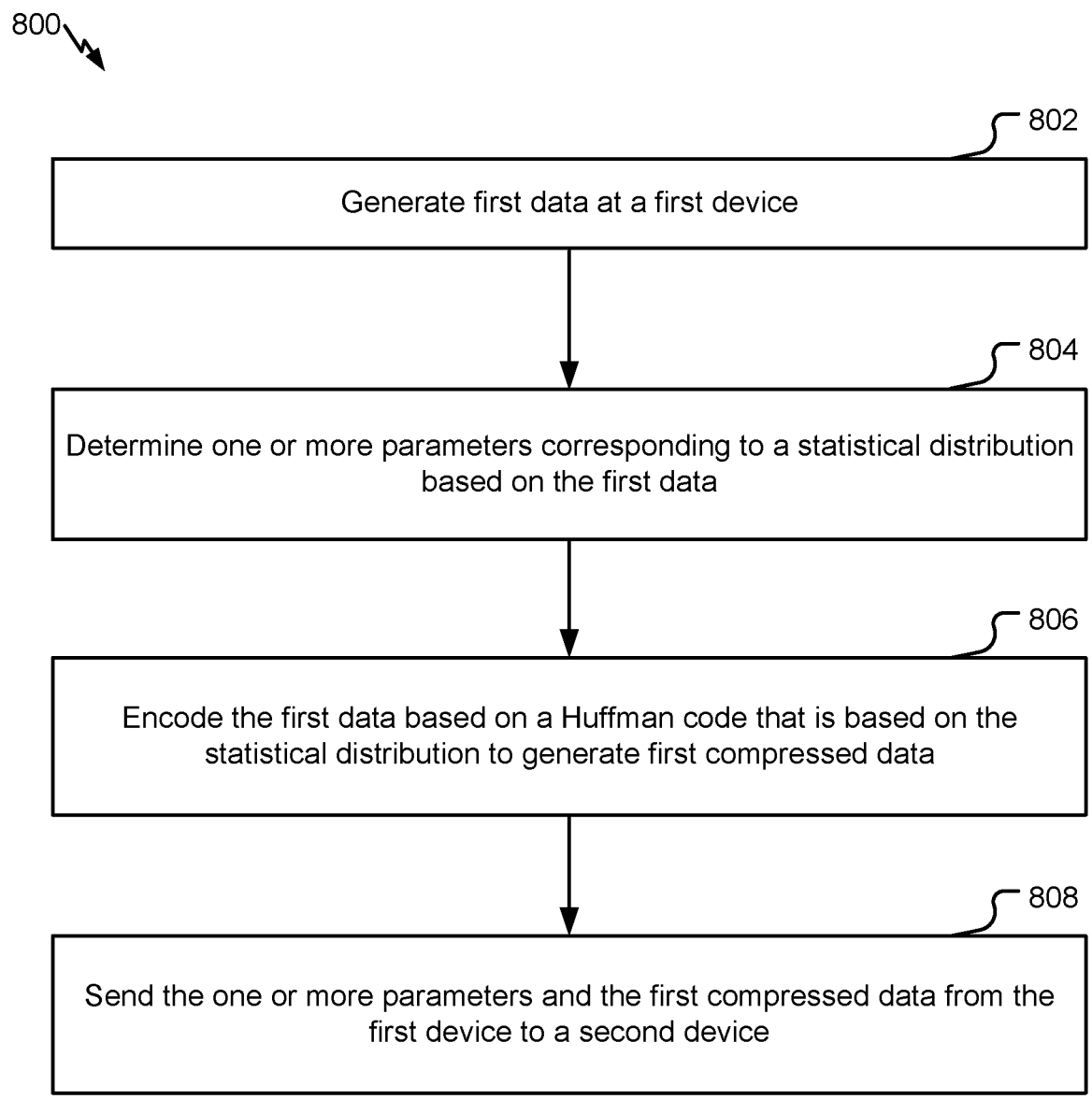
FIG. 8 is a flow chart of an example of a method of sharing compressed data and one or more parameters.

FIG. 8 illustrates a method 800 of compressing data based on a frequency-based code. In some implementations, the method 800 is performed by the first device 102 or the second device 104 of FIGS. 1, 5, and 6, as non-limiting examples.

The method 800 includes generating data at a first device, at 802. For example, the first device includes the first device 102 and the data includes the first data 120 of FIG. 1.

The method 800 includes determining one or more parameters corresponding to a statistical distribution of values based on the data, at 804. For example, the one or more parameters includes the one or more parameters 122 of FIG. 1 that are associated with a statistical model that models the first data 120. In a particular implementation, the one or more parameters include a mean and a standard deviation. For example, the mean and the standard deviation include the mean 502 and the standard deviation 504 of FIG. 5. In a particular implementation, the statistical distribution includes a Gaussian distribution.

The method 800 includes encoding the data based on a frequency-based code that is based on the statistical distribution to generate compressed data, at 806. For example, the frequency-based code includes the frequency-based code 124 and the compressed data includes the first compressed data 126 of FIG. 1. In a particular implementation, the frequency-based code includes a Huffman code. For example, the Huffman code includes the Huffman table 506 of FIG. 5.

The method 800 includes sending the one or more parameters and the compressed data from the first device to the second device, at 808. For example, the one or more parameters 122 and the first compressed data 126 are sent to the second device 104 via the network 106 as the one or more data packets 128.

In a particular implementation, the method 800 includes determining the frequency-based code based on frequency values indicated by the statistical distribution and corresponding to one or more values indicated by the data. To illustrate, the frequency-based code 124 (e.g., an encoding of one or more values) is determined based on values indicated by the statistical distribution 202, as described with reference to FIG. 2.

In another particular implementation, the method 800 includes storing the data at a memory of the first device prior to determining the one or more parameters and encoding the data, appending a header that includes the one or more parameters to the compressed data to generate a data file, and overwriting the data with the data file. To illustrate, in some implementations, the first data 120 is stored at the memory 114 prior to determining the statistical distribution, and after the first compressed data 126 is generated, the first compressed data 126 is stored to the same location in the memory 114, thereby overwriting the first data 120. In some implementations, the one or more parameters are determined and the data is encoded responsive to satisfaction of a threshold condition at the first device. For example, the one or more parameters 122 are determined and the first data 120 is encoded responsive to satisfaction of the threshold condition 612. The threshold condition corresponds to a size of the data stored at the memory, a duration of time associated with generating the data, receipt of an instruction from the second device, a condition indicated by a mission profile stored at the memory, or a combination thereof.

In another particular implementation, the method 800 includes generating second data at the first device, encoding the second data based on the frequency-based code to generate second compressed data, and sending the second compressed data to the second device. For example, the second compressed data 512 is generated by encoding second data 510 based on the Huffman table 506, as further described with reference to FIG. 5. The header 508 and the second compressed data 512 are sent to the second device 104 via the one or more data packets 520.

In another particular implementation, the method 800 includes generating second data at the first device and determining whether a threshold condition is satisfied. The method 800 also includes, responsive to satisfaction of the threshold condition, determining a second set of parameters corresponding to a second statistical distribution of values that is based at least in part on the second data. The method 800 further includes encoding the second data based on a second frequency-based code based on the second statistical distribution to generate second compressed data and sending the second set of parameters and the second compressed data to the second device. To illustrate, responsive to the threshold condition 612 being satisfied, the second data 602 is analyzed to determine a second statistical model that is associated with the second mean 606 and the second standard deviation 608. The second Huffman table 610 that is based on the second statistical model is used to encode the second data 602 to generate the second compressed data 616, which is sent to the second device 104. In a particular implementation, the threshold condition corresponds to a difference between a value of a first parameter of the one or more parameters and a value of a second parameter of the second set of parameters. In another particular implementation, the threshold condition corresponds to a size of the second data or an amount of time associated with generating the second data. In another particular implementation, the threshold condition is modifiable based on user input received at the first device.

The method 800 enables data to be compressed and transmitted using fewer bits than other methods of transmitting compressed data with data indicative of the code used to compress the data. Because the method 800 includes sending one or more parameters instead of data indicative of the code, fewer bits are transmitted in addition to the compressed data. Thus, network overhead may be reduced when transmitting compressed data, and compressed data may be transmitted at a higher data rate as compared to other techniques of compressing data.

In a particular implementation, one or more of the elements of the method 700 of FIG. 7 or the method 800 of FIG. 8 may be performed by a processor that executes instructions stored on a non-transitory, computer readable medium. For example, a non-transitory computer readable medium may store instructions that, when executed by a processor, cause the processor to perform operations including generating data at a first device. The operations may include determining one or more parameters corresponding to a statistical distribution of values based on the data. The operations may include encoding the data based on a frequency-based code that is based on the statistical distribution to generate compressed data. The operations may further include sending the one or more parameters and the compressed data from the first device to a second device.

Figure 9:
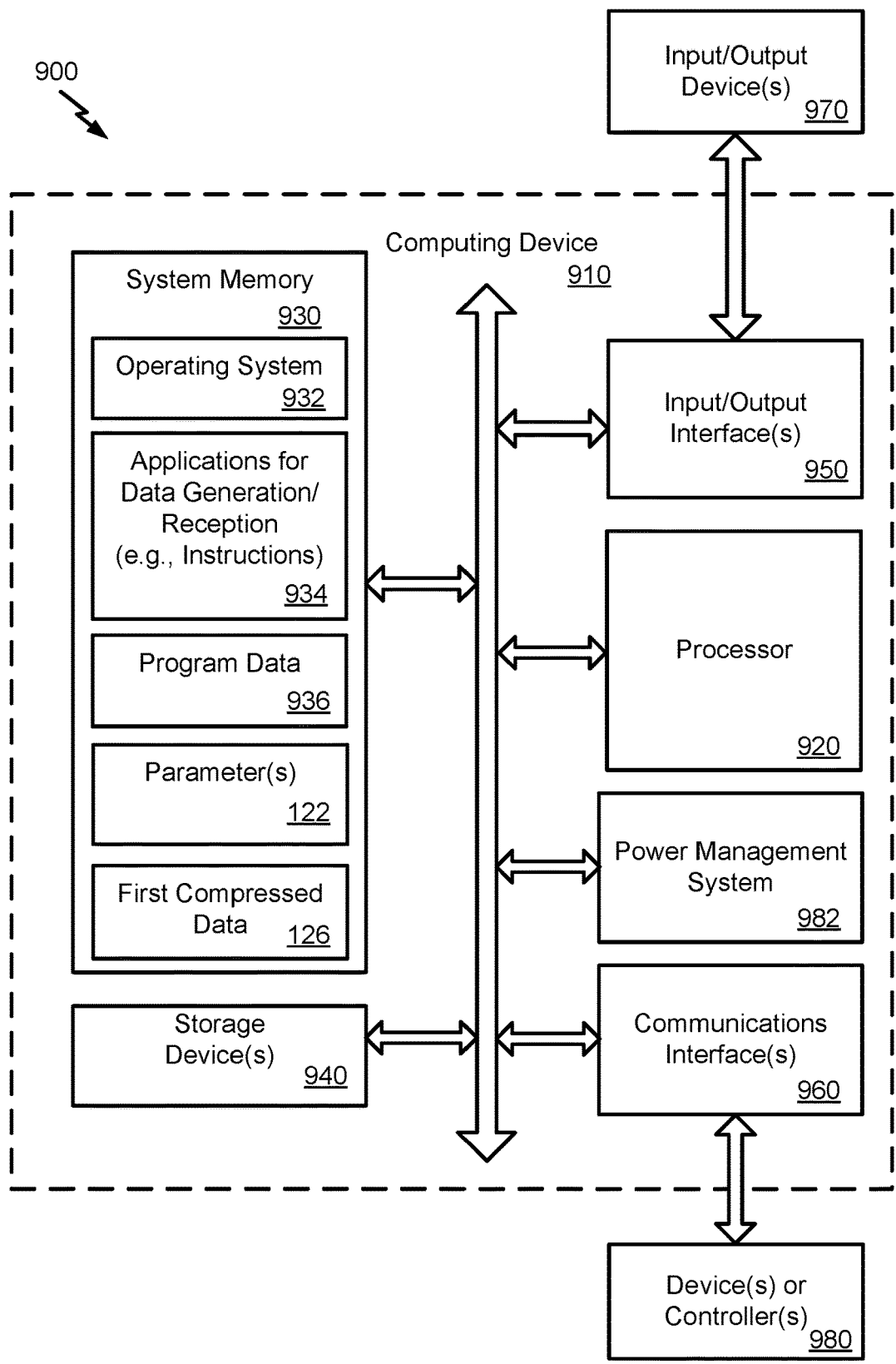
FIG. 9 is a block diagram that illustrates a particular implementation of a computing device configured to compress data based on a frequency-based code.

FIG. 9 is a block diagram of a computing environment 900 including a computing device 910 operable to compress data based on a frequency-based code. For example, the computing device 910 may be included within or correspond to the first device 102 of FIG. 1. In a particular implementation, the computing device 910 is integrated within or included on-board a vehicle, such as an aircraft. In another particular implementation, the computing device 910 is an IoT device.

The computing device 910 includes at least one processor 920. Within the computing device 910, the at least one processor 920 communicates with a system memory 930, one or more storage devices 940, one or more input/output interfaces 950, one or more communications interfaces 960, a power management system 982, or a combination thereof.

The system memory 930 includes volatile memory devices (e.g., random access memory (RAM) devices), nonvolatile memory devices (e.g., read-only memory (ROM) devices, programmable read-only memory, and flash memory), or both. The system memory 930 includes an operating system 932, which in some implementations includes a basic input/output system for booting the computing device 910 as well as a full operating system to enable the computing device 910 to interact with users, other programs, and other devices. The system memory 930 also includes one or more applications 934 (e.g., instructions) for data generation/reception, program data 936, the one or more parameters 122, and the first compressed data 126. The program data 936 includes data used by the applications 934 to perform respective functions of the applications 934. The applications 934 include instructions executable by the at least one processor 920 to generate or to receive data to be compressed. For example, the applications 934 may include one or more sensor applications configured to operate one or more sensors (or to receive sensor data from one or more external sensors). In other implementations, the applications 934 include other applications that generate data to be compressed, such as an application that manages data in a smart chip of a badge, as a non-limiting example. Additionally, the applications 934 include instructions executable by the at least one processor 920 to analyze data and to generate a statistical model based on the data, the statistical model associated with the one or more parameters 122. The instructions are further executable to encode data using a frequency-based code that is based on the statistical distribution to generate the first compressed data 126, and to store the one or more parameters 122 (e.g., in a header) and the first compressed data 126 at the system memory 930.

The one or more storage devices 940 include nonvolatile storage devices, such as magnetic disks, optical disks, or flash memory devices. In some implementations, the one or more storage devices 940 include both removable and non-removable memory devices. In a particular implementation, the one or more storage devices 940 are configured to store the operating system 932, the applications 934, the program data 936, the one or more parameters 122, the first compressed data 126, or a combination thereof. The system memory 930 and the one or more storage devices 940 are physical devices and are not a signal.

In a particular implementation, the at least one processor 920 is configured to execute computer executable instructions, such as the applications 934, stored at the system memory 930. The instructions are executable to cause the at least one processor 920 to perform operations. The operations include generating data at a first device and determining the one or more parameters 122 corresponding to a statistical distribution of values based on the data. The operations include encoding the data based on a frequency-based code that is based on the statistical distribution to generate the first compressed data 126. The operations further include sending the one or more parameters 122 and the first compressed data 126 to a second device, storing the one or more parameters 122 and the first compressed data 126 to the system memory 930, or both.

The one or more input/output interfaces 950 enable the computing device 910 to communicate with one or more input/output devices 970 to facilitate user interaction. For example, the one or more input/output interfaces 950 are adapted to receive input from a user, to receive input from another computing device, or a combination thereof. In some implementations, the input/output interfaces 950 conform to one or more standard interface protocols, including serial interfaces (e.g., universal serial bus (USB) interfaces or Institute of Electrical and Electronics Engineers (IEEE) interface standards), parallel interfaces, display adapters, audio adapters, or custom interfaces. In some implementations, the input/output devices 970 include user interface devices and displays, including some combination of buttons, keyboards, pointing devices, displays, speakers, microphones, touch screens, and other devices. In some implementations, the at least one processor 920 detects interaction events based on user input received via the input/output interfaces 950. Additionally, in some implementations, the at least one processor 920 sends a display to a display device via the input/output interfaces 950.

The one or more communications interfaces 960 enable the computing device 910 to communicate with one or more other computing devices or controllers 980. The one or more communications interfaces 960 may include wired Ethernet interfaces, IEEE 802 wireless interfaces, Bluetooth communication interfaces, electrical (or power line) interfaces, optical or radio frequency interfaces, or other wired or wireless interfaces. The other computer devices or controllers 980 include host computers, servers, workstations, portable computers, telephones, tablet computers, or any other communication device or component, as non-limiting examples. The power management system 982 is configured to manage power resources and to suppress one or more operations or to put the computing device 910 into a low power mode (e.g., a "sleep mode") if power resources (e.g., battery charge) fall below a threshold amount.

Figure 10:
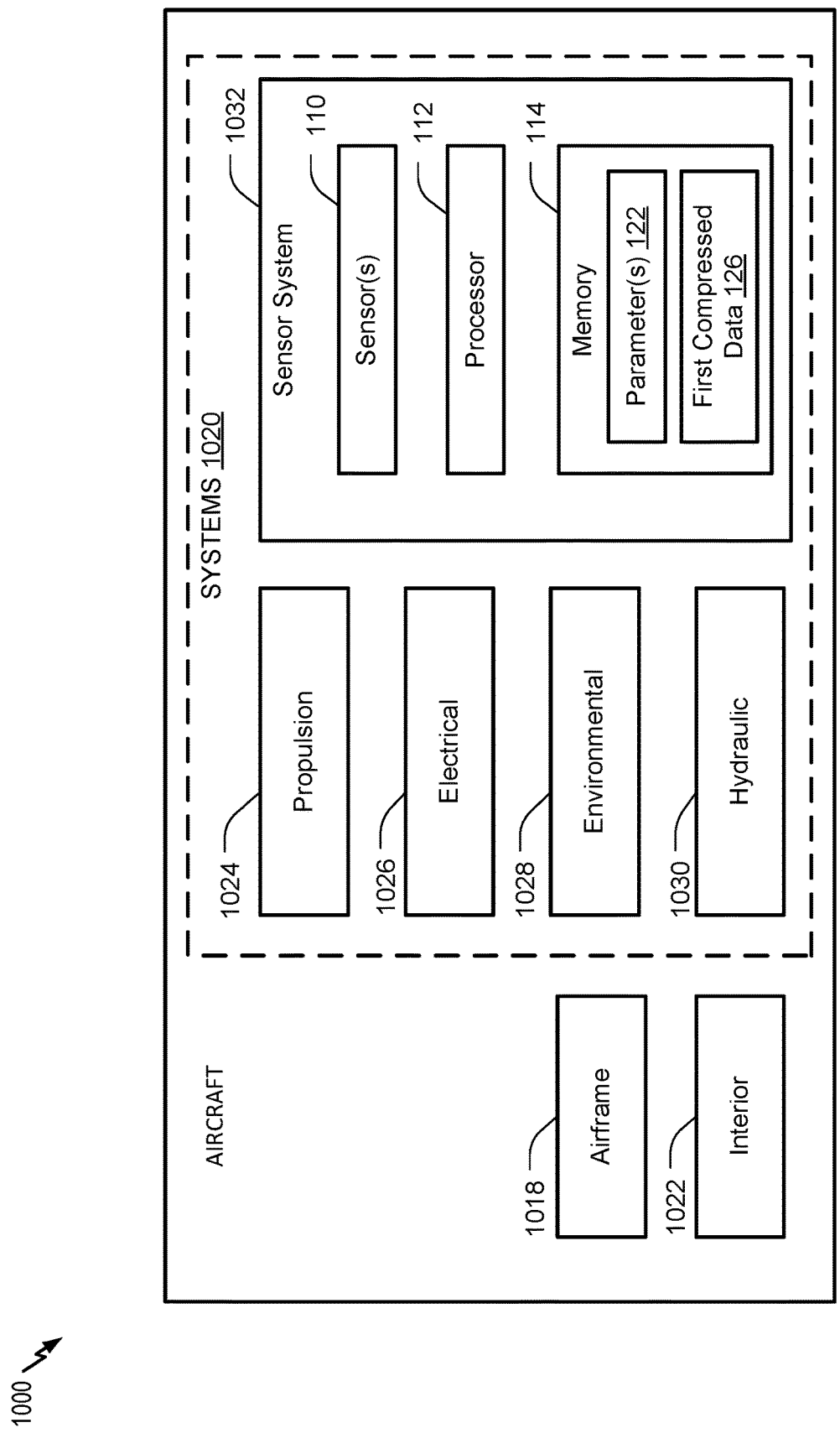
FIG. 10 is a block diagram of an aircraft including a sensor system configured to compress data according to a frequency-based code.

Aspects of the disclosure may be described in the context of an aircraft 1000 as shown in FIG. 10. The aircraft 1000 may include a sensor system 1032 that includes the sensor 110, the processor 112, and the memory 114 configured to store the one or more parameters 122 and the first compressed data 126, as described with reference to FIGS. 1, 5, and 6. As shown in FIG. 10, the aircraft 1000 also includes an airframe 1018 with a plurality of systems 1020 and an interior 1022. Examples of the plurality of systems 1020 include one or more of a propulsion system 1024, an electrical system 1026, a hydraulic system 1028, an environmental system 1030, and the sensor system 1032. Any number of other systems may be included. Although an aerospace example is shown, the present disclosure may be applied to other industries. For example, the sensor system 1032 may be used onboard a manned or unmanned vehicle (such as a satellite, a watercraft, or a land-based vehicle), or in a building or other structure.

Although one or more of FIGS. 1-10 may illustrate systems, apparatuses, and/or methods according to the teachings of the disclosure, the disclosure is not limited to these illustrated systems, apparatuses, and/or methods. One or more functions or components of any of FIGS. 1-10 as illustrated or described herein may be combined with one or more other portions of another of FIGS. 1-10. For example, one or more elements of the method 700 of FIG. 7 may be performed in combination with one or more elements of the method 800 of FIG. 8 or with other operations described herein. Accordingly, no single implementation described herein should be construed as limiting and implementations of the disclosure may be suitably combined without departing form the teachings of the disclosure. As an example, one or more operations described with reference to FIG. 7 or 8 may be optional, may be performed at least partially concurrently, and/or may be performed in a different order than shown or described.

The illustrations of the examples described herein are intended to provide a general understanding of the structure of the various implementations. The illustrations are not intended to serve as a complete description of all of the elements and features of apparatus and systems that utilize the structures or methods described herein. Many other implementations may be apparent to those of skill in the art upon reviewing the disclosure. Other implementations may be utilized and derived from the disclosure, such that structural and logical substitutions and changes may be made without departing from the scope of the disclosure. For example, method operations may be performed in a different order than shown in the figures or one or more method operations may be omitted. Accordingly, the disclosure and the figures are to be regarded as illustrative rather than restrictive.

Moreover, although specific examples have been illustrated and described herein, it should be appreciated that any subsequent arrangement designed to achieve the same or similar results may be substituted for the specific implementations shown. This disclosure is intended to cover any and all subsequent adaptations or variations of various implementations. Combinations of the above implementations, and other implementations not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single implementation for the purpose of streamlining the disclosure. Examples described above illustrate but do not limit the disclosure. It should also be understood that numerous modifications and variations are possible in accordance with the principles of the present disclosure. As the following claims reflect, the claimed subject matter may be directed to less than all of the features of any of the disclosed examples. Accordingly, the scope of the disclosure is defined by the following claims and their equivalents.

What is claimed is:

1. A method comprising:
   generating data at a first device;
   determining one or more parameters corresponding to a statistical distribution of values based on the data;
   generating a frequency-based code using the one or more parameters;
   encoding the data based on the frequency-based code to generate compressed data; and
   sending the one or more parameters and the compressed data from the first device to a second device, the second device configured to generate the frequency-based code using the one or more parameters in order to decode the compressed data.

2. The method of claim 1, wherein the one or more parameters include a mean and a standard deviation.

3. The method of claim 1, wherein the statistical distribution comprises a Gaussian distribution.

4. The method of claim 1, wherein the frequency-based code comprises a Huffman code.

5. The method of claim 1, further comprising determining the frequency-based code based on frequency values indicated by the statistical distribution and corresponding to one or more values indicated by the data.

6. The method of claim 1, further comprising:
   storing the data at a memory of the first device prior to determining the one or more parameters and encoding the data;
   appending a header to the compressed data to generate a data file, the header including the one or more parameters; and
   overwriting the data with the data file.

7. The method of claim 6, wherein the one or more parameters are determined and the data is encoded responsive to satisfaction of a threshold condition at the first device, wherein the threshold condition corresponds to a size of the data stored at the memory, a duration of time associated with generating the data, receipt of an instruction from the second device, a condition indicated by a mission profile stored at the memory, or a combination thereof.

8. The method of claim 1, further comprising:
   generating second data at the first device;
   encoding the second data based on the frequency-based code to generate second compressed data; and
   sending the second compressed data to the second device.

9. The method of claim 1, further comprising:
   generating second data at the first device;

determining whether a threshold condition is satisfied;
responsive to satisfaction of the threshold condition, determining a second set of parameters corresponding to a second statistical distribution of values that is based at least in part on the second data;
generating a second frequency-based code based on the second statistical distribution;
encoding the second data based on the second frequency-based code to generate second compressed data; and
sending the second set of parameters and the second compressed data to the second device.

10. The method of claim 9, wherein the threshold condition corresponds to a difference between a value of a first parameter of the one or more parameters and a value of a second parameter of the second set of parameters.

11. The method of claim 9, wherein the threshold condition corresponds to a size of the second data or an amount of time associated with generating the second data.

12. The method of claim 9, wherein the threshold condition is modifiable based on user input received at the first device.

13. A device comprising:
a sensor configured to generate data;
a memory configured to store the data; and
a processor coupled to the memory and configured to execute instructions to perform operations comprising:
  determining a mean and a standard deviation corresponding to a statistical distribution of values based on the data;
  generating a Huffman code using the mean and standard deviation;
  encoding the data based on the Huffman code to generate compressed data;
  storing the mean, the standard deviation, and the compressed data at the memory; and
  initiating transmission of the mean, the standard deviation, and the compressed data to a second device, the second device configured to generate the Huffman code using the mean and the standard deviation in order to decode the compressed data.

14. The device of claim 13, further comprising a network interface configured to send the mean, the standard deviation, and the compressed data to the second device.

15. The device of claim 13, wherein the sensor comprises a temperature sensor, a magnetometer, a radiation sensor, an air pressure sensor, an airflow sensor, a vibration sensor, an impact sensor, an accelerometer, or a combination thereof.

16. The device of claim 13, wherein the sensor, the memory, and the processor are integrated within an aircraft.

17. The device of claim 13, wherein the sensor, the memory, and the processor are integrated within an "Internet of Things" (IoT) device.

18. A device comprising:
a network interface configured to receive one or more parameters and compressed data from a second device, the one or more parameters corresponding to a statistical distribution of values of uncompressed data corresponding to the compressed data;
a memory; and
a processor coupled to the memory and configured to execute instructions to perform operations comprising:
  generating a frequency-based code using the one or more parameters;
  decoding the compressed data based on the frequency-based code to generate data; and
  storing the data at the memory.

19. The device of claim 18, wherein the one or more parameters are included in a header.

20. The device of claim 18, wherein the network interface is further configured to receive a second set of parameters and second compressed data from the second device, the second compressed data encoded using a second frequency-based code generated using the second set of parameters, and wherein the operations further comprise:
  determining the second frequency-based code using the second set of parameters;
  decoding the second compressed data based on the second frequency-based code to generate second data; and
  storing the second data at the memory.

* * * * *